United States Patent [19]

Satou et al.

[11] Patent Number: 5,214,668
[45] Date of Patent: May 25, 1993

[54] TEMPERATURE DETECTOR AND A TEMPERATURE COMPENSATED OSCILLATOR USING THE TEMPERATURE DETECTOR

[75] Inventors: Kiyoshi Satou; Takaaki Hara, both of Tokyo, Japan

[73] Assignee: Nec Corporation, Tokyo, Japan

[21] Appl. No.: 768,809

[22] Filed: Sep. 30, 1991

[30] Foreign Application Priority Data

Sep. 28, 1990 [JP] Japan .................................. 2-261334

[51] Int. Cl.$^5$ ...................... G01K 11/26; H01L 41/08
[52] U.S. Cl. .................................. 374/117; 374/170; 310/315; 331/66
[58] Field of Search ............... 374/117, 141, 152, 163, 374/170; 331/66; 310/315, 346, 360, 361, 367

[56] References Cited

U.S. PATENT DOCUMENTS

| | | | |
|---|---|---|---|
| 3,826,931 | 7/1974 | Hammond | 310/315 X |
| 3,978,432 | 8/1976 | Onoe | 310/315 X |
| 4,551,031 | 11/1985 | Ishikawa et al. | 374/117 |
| 4,558,248 | 12/1985 | Valentin | 310/315 |
| 4,848,923 | 7/1989 | Ziegler et al. | 374/117 |
| 4,872,765 | 10/1989 | Schodowski | 374/117 |

FOREIGN PATENT DOCUMENTS

| | | | |
|---|---|---|---|
| 61-220386 | 9/1986 | Japan | 310/315 |
| 2122825 | 1/1984 | United Kingdom | 374/117 |
| 2246862 | 2/1992 | United Kingdom | |

OTHER PUBLICATIONS

V. Candelier, Low Profile High Stability Digital TCXO, Symposium on Frequency Control, Jun. 1989 pp. 51-54.

Benjaminson, Albert, Factors Influencing Stability in the Microcomputer, May 1990 pp. 597-614.

*Primary Examiner*—William A. Cuchlinkski, Jr.
*Assistant Examiner*—G. Bradley Bennett
*Attorney, Agent, or Firm*—Whitham & Marhoefer

[57] ABSTRACT

A temperature compensated oscillator and a temperature detector have a temperature sensor having a single case in which a pair of AT cut crystal resonator having substantially the same natural oscillation frequency and different cut angles from each other are accommodated. The crystal resonators each constitutes the resonance circuit of respective one of two oscillation circuits. A difference in frequency between the output frequencies of the oscillation circuits is representative of a detected temperature.

6 Claims, 4 Drawing Sheets

TEMPERATURE DETECTOR AND A TEMPERATURE COMPENSATED OSCILLATOR USING THE TEMPERATURE DETECTOR

BACKGROUND OF THE INVENTION

1. Field of the Invention

The present invention relates to a temperature detector using crystal resonators and a temperature compensated oscillator having the temperature detector.

2. Description of the Prior Art

A temperature compensated oscillator has a voltage controlled oscillator (VCO) which is a main oscillator, a temperature detector for detecting the temperature around the main oscillator, and a control voltage generating circuit for generating a control voltage from the detected temperature, which maintains the oscillation frequency of the VCO constant by compensating for the changes in ambient temperature and applying such a control voltage to the VCO. The temperature detector has an oscillator with a piezoelectric resonator whose oscillation frequency varies with its temperature. Temperature is detected in terms of the oscillation frequency of the oscillator.

One example of such a temperature detector using the combination of an AT cut and a Y cut crystal resonators is described in a paper entitled "LOW PROFILE HIGH STABILITY DIGITAL TCXO; ULTRA LOW POWER CONSUMPTION TCXO" by V. Candelier et al., Proceedings of the 43rd Annual Symposium on Frequency Control, 1989, pp. 51-54. An AT cut crystal resonator has a small temperature coefficient of natural oscillation frequency while a Y cut crystal resonator has a large temperature coefficient of natural oscillation frequency. In such a case, the temperature detector counts the output pulses of the oscillator implemented by the AT cut crystal resonator while the output of the oscillator implemented by the Y cut crystal resonator is in a high level. The temperature detector resets the count to zero every predetermined period while delivering the count at the time just before resetting as a detected temperature signal.

Another example of the temperature detector using a single crystal resonator is disclosed in a paper entitled "FACTORS INFLUENCING STABILITY IN THE MICROCOMPUTER-COMPENSATED CRYSTAL OSCILLATOR" by A. Benjaminson, Proceedings of the 44th Annual Symposium on Frequency Control, 1990, pp. 597-614. This detector has a single SC cut crystal resonator for temperature detection and excites the resonator by two oscillation circuits assigned to, respectively, a fundamental harmonic and a higher harmonic. As a result, the detector generates oscillator outputs, one is a fundamental harmonic and the other is a tertiary higher harmonic. A signal representative of a frequency difference between the two oscillation outputs is used as a detected temperature signal.

The problem with the above-described dual resonator scheme is that the temperature detection error increases transiently when the temperature is sharply changed due to the turn-on of a power source or a sharp change in ambient temperature. Specifically, to enhance accurate temperature detection, a large ratio is usually selected between the natural frequency (fA) of the AT cut resonator and the natural frequency (fY) of the Y cut resonator (e.g. fA = 1 MHz and fY = 10 kHz). As a result, the Y cut resonator has a far larger volume and a far larger heat capacity than those of the AT cut resonator. Therefore, the two resonators are noticeably different in thermal time constant. When the temperature is sharply changed, a temperature detection error ascribable to the temperature difference between the two resonators is not avoidable during the transient period to a steady temperature state.

On the other hand, the single SC cut crystal resonator scheme is free from the temperature detection error ascribable to the difference in thermal time constant. However, this conventional scheme has a drawback that the oscillation circuit for generating the tertiary higher harmonic increases power consumption. Specifically, the power consumption by the semiconductor devices constituting the oscillation circuits and the entire circuitry including them increases substantially in proportion to oscillation frequency. Hence, the oscillation circuit assigned to the tertiary higher harmonic consumes almost three times greater power than the oscillation circuit assigned to the fundamental harmonic. It follows that the total power consumption is almost four times greater than that of the oscillation circuit assigned to the fundamental harmonic.

BRIEF SUMMARY OF THE INVENTION

1. Object of the Invention

It is, therefore, an object of the present invention to provide a temperature compensated oscillator and a temperature detector which are free from the above-discussed temperature detection errors ascribable to a difference in thermal time constant and consumes a minimum of power.

2. Summary of the Invention

In accordance with the present invention, a temperature compensated oscillator has a pair of AT cut crystal resonator pieces having substantially the same natural oscillation frequency and different cut angles from each other, a case member holding the resonator pieces in an oscillatable state, electrode films formed on opposite surface of each resonator piece, and leads connecting the electrode films to terminals disposed located outside the case member. The resonator pieces are each connected to respective one of oscillation circuits to be excited by the latter, thereby producing two different oscillation outputs. A difference in frequency between the two oscillation outputs is representative of a detected temperature. The two resonator pieces have substantially the same natural oscillation frequency and, therefore, substantially the same dimensions and time constant. Since the resonator pieces are accommodated in a single case, their temperature remain the same at all times to eliminate detection errors.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
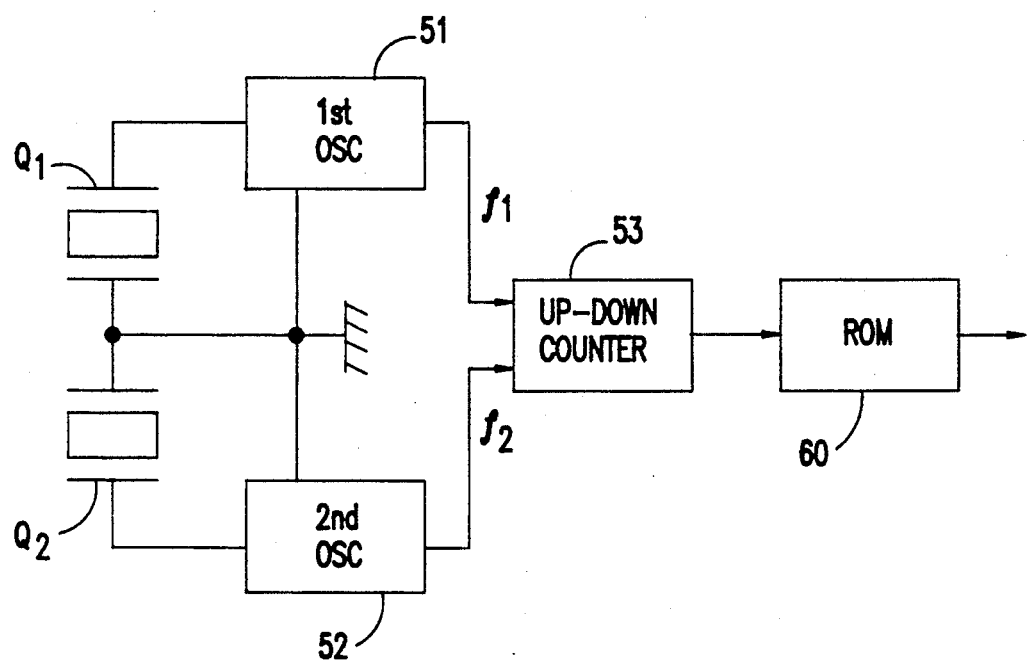
FIG. 1 is a block diagram showing a temperature detector embodying the present invention.

Referring to FIG. 1, a temperature detector of the present invention comprises a first and a second AT cut crystal resonator Q1 and Q2, a first and a second oscillator 51 and 52, an up-down counter 53, and a ROM 60. The first and second resonators Q1 and Q2 have almost the same natural frequencies f1 and f2, respectively, and have the different cut angles from each other. For example, the cut angles of the first and the second AT cut crystal resonators Q1 and Q2 are 35°25' and 35°17', respectively. The first and second oscillators 51 and 52 include the first and second crystal resonators Q1 and Q2 as a part of their resonating circuit, respectively. Thus, the first oscillator 51 oscillates the first resonator Q1 at the frequency f1 and the second oscillator 51 oscillates the second resonator Q2 at the frequency f2. The first oscillator 51 outputs rectangle wave signal having the frequency f1 as a first oscillated signal. In the same way, the second oscillator 52 output a rectangle wave signal having the frequency f2 as a second oscillated signal. The up-down counter 53 receives the first and second oscillated signals on the count-up and count-down terminals, respectively. The counter 53 is reset at every predetermined period, which is sufficiently short compared with changing period of the temperature, and outputting its counting value every predetermined period as a phase difference data signal. The phase difference data signal fluctuates responsive to the temperatures of the first and second crystal resonators. The reset operation is achieved by using a reset signal which is frequency-divided signal of one of the first and second oscillated signal.

Figure 2:
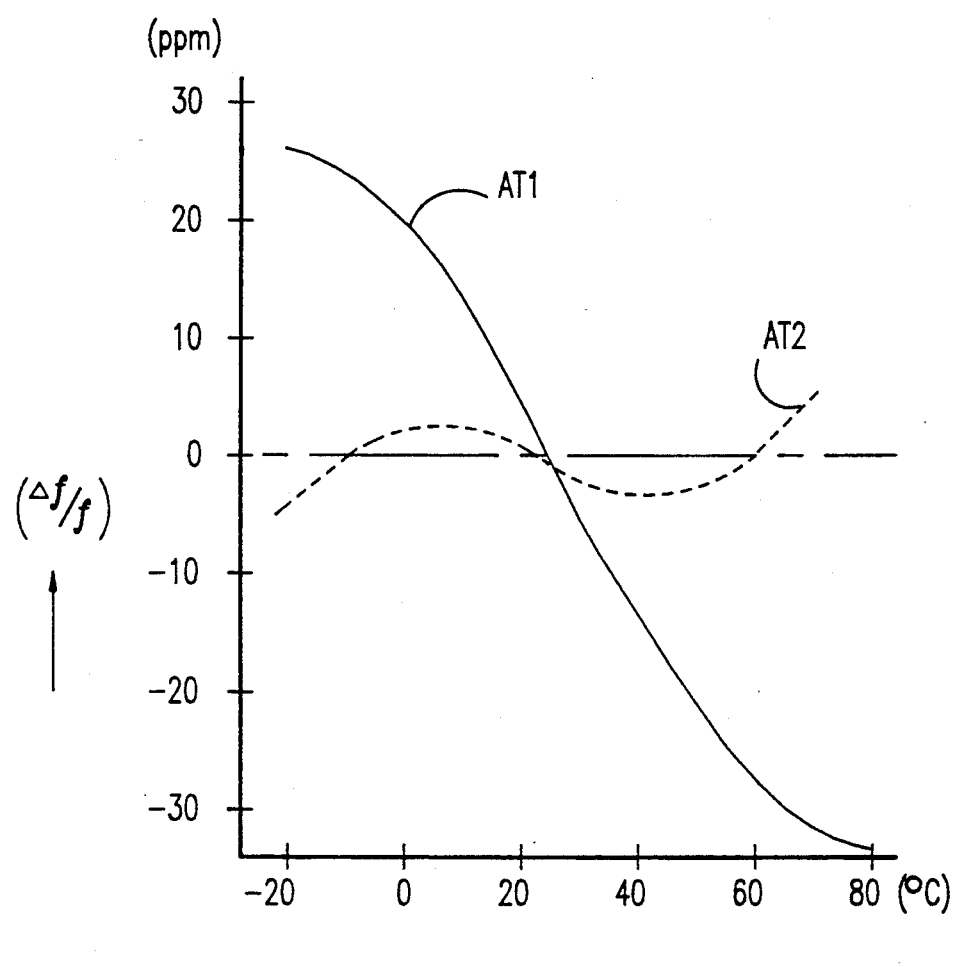
FIG. 2 is a graph representative of natural oscillation frequency to temperature characteristics of crystal resonators included in the embodiment.

FIG. 2 shows specific resonance frequency to temperature characteristics of the crystal resonators Q1 and Q2. In the figure, the abscissa and the ordinate indicate respectively temperature and relative frequency which is the variation rate ($\Delta f/f$) of the resonance frequency. Specifically, curves AT1 and AT2 represent respectively the changes in the resonance frequencies of the crystal resonators Q1 (AT cut with cut angle of 35°25') and Q2 (AT cut with cut angle of 35°17') with respect to temperature. Therefore, the phase difference data signal monotonously increases (or monotonously decreases) with the elevation of temperature. The ROM 60 stores a table showing correspondence between the phase difference data signal and the temperature, and outputs a temperature signal which represents the detected temperature, in response to the received phase difference data signal.

Figure 3:
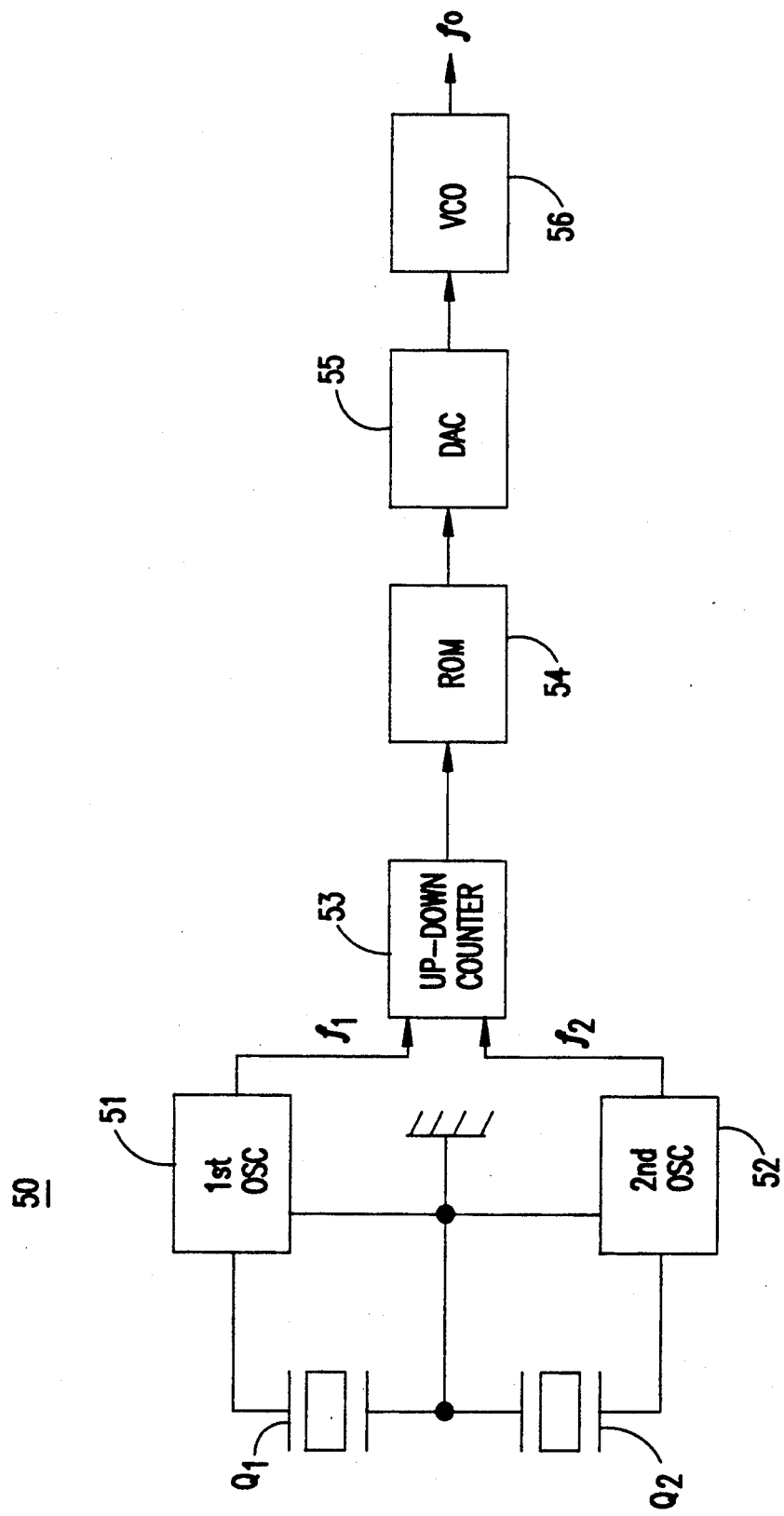
FIG. 3 is a block diagram schematically showing a temperature compensated oscillator having a temperature detector embodying the present invention.

FIG. 3 shows an embodiment of a temperature compensated oscillating circuit of the invention. Referring to FIG. 3, the oscillating circuit comprises a first and a second crystal resonator Q1 and Q2, a first and a second oscillator 51 and 52, an up-down counter 53, a ROM 54, a digital-to-analog conventing circuit (DAC) 55 and a voltage controlled oscillator (VCO) 56. In FIG. 3, elements having the same reference numeral are the same as the elements shown in FIG. 1. Thus, further descriptions are eliminated. The up-down counter 53 outputs a frequency difference data signal. The ROM 54 receives the frequency difference data signal as an address signal, and outputs a digital control voltage data signal. The DAC 55 converts the digital control voltage data signal into an analog control voltage signal to maintain a frequency of an output signal of the VCO 56 at a frequency fo. The ROM 54 stores a table which is designed to offset a frequency drift of the VCO 56.

Figure 4A:
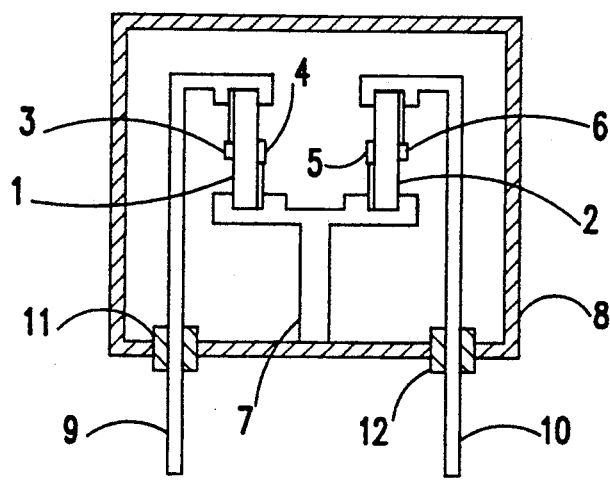
FIG. 4A is a section showing a specific configuration of the crystal resonators included in the embodiment.
Figures 4B, 4C:
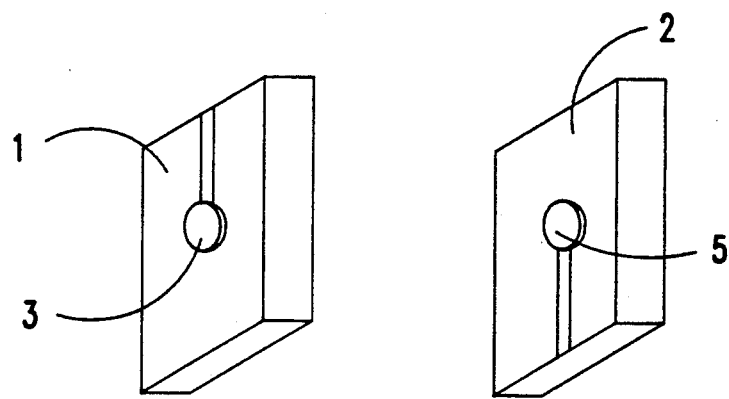
FIGS. 4B and 4C are perspective views each showing the construction of a particular element included in the configuration of FIG. 4A.

Referring to FIGS. 4A-4C, a specific arrangement of the crystal resonators Q1 and Q2 will be described. There are shown flat resonator pieces 1 and 2 corresponding respectively to the AT cut crystal resonators Q1 and Q2 which have substantially the same natural oscillation frequency and different cut angles, as stated earlier. The resonator pieces 1 and 2 are retained by support means in a vertical position and in parallel to each other. The support means so retaining the resonator pieces 1 and 2 is accommodated in a metallic case 8. Electrodes 3 and 4 for electrical connection are formed on opposite sides of the resonator piece 1 by the evaporation of gold. Likewise, electrodes 5 and 6 are provided on the resonator piece 2 by the evaporation of gold. The resonator pieces 1 and 2 are firmly retained by the upper end of a generally T-shaped conductive support 7 at the lower ends thereof. The conductive support 7 is disposed in and affixed to the bottom of the case 8 at the lower end thereof. The electrode 4 of the resonator piece 1 and the electrode 5 of the resonator piece 2 are electrically connected to the upper end of the conductive support 7. Elongate conductive terminals 9 and 10 extend throughout the bottom wall of the metallic case 8 and are affixed to the latter with the intermediary of insulating members 11 and 12, respectively. The electrodes 3 and 6 of the resonators 1 and 2, respectively, are retained by and electrically connected to the upper ends of the terminals 9 and 10, respectively.

To connect the assembly shown in FIGS. 4A-4C to the oscillator adapted for temperature detection, the bottom of the metal case 8 is placed on a circuit board, not shown, and then the terminals 9 and 10 are connected in a predetermined manner. Since the resonator pieces 1 and 2 are located face-to-face and each in a vertical position, the area of the bottom of the metal case 8, i.e., the area which the case 8 occupies on a circuit board is reduced.

Figure 5:
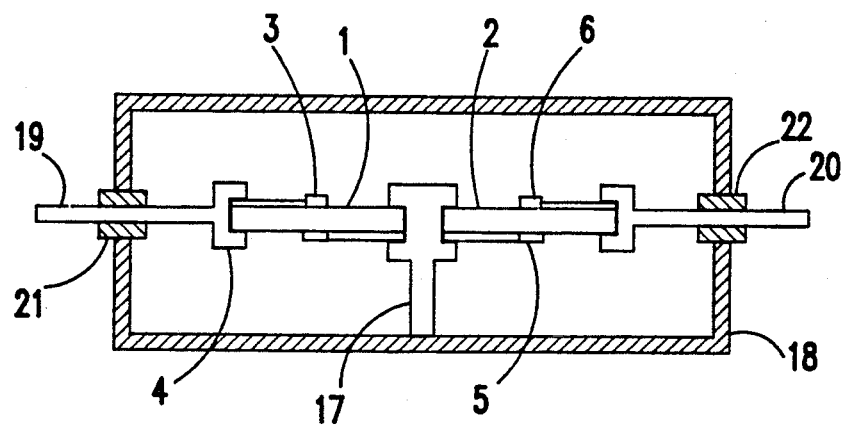
FIG. 5 is a view similar to FIG. 4A, showing another specific configuration of the crystal resonators.

FIG. 5 shows another specific configuration of the crystal resonators Q1 and Q2. In the figures, the same or similar parts and elements are designated by like reference numerals, and redundant description will be avoided for simplicity. As shown, the AT cut flat resonator pieces 1 and 2 are each retained in a horizontal position by support means which will be described. The resonator pieces 1 and 2 lie in the same plane. The support means with the resonator pieces 1 and 2 is accommodated in a metallic case 18. The resonator pieces 1 and 2 are supported by and electrically connected to the upper end of a rod-like conductive support 17 at the ends thereof which adjoin each other. Rod-like conductive terminals 19 and 20 extend throughout opposite side walls of the case 18 and are affixed to the latter with the intermediary of insulating members 21 and 22, respectively. The ends of the resonator pieces 1 and 2 which are remove from the above-mentioned adjoining ends are retained by and electrically connected to the inner ends of the conductive terminals 19 and 20, respectively.

To mount the resonators 1 and 2 on a printed circuit board, the bottom of the case 18 is placed on the circuit board, and then the outer ends of the terminals 19 and 20 are bend downward. Since the configuration shown in FIG. 4 has the resonator pieces 1 and 2 positioned horizontally in the same plane, the height thereof above the circuit board is reduced. Such a configuration is feasible for so-called planar mounting.

In the above-described specific configurations of the quartz vibrators $Q_1$ and $Q_2$, the resonator pieces 1 and 2 have substantially the same natural oscillation frequency and, therefore, substantially the same dimensions, thus achieving substantially the same time constant. Moreover, since the resonator pieces 1 and 2 adjoin each other within a single case, their temperatures remain the same at all times during operation. This eliminates temperature detection errors particular to the conventional oscillator using an AT cut and a Y cut crystal resonator.

In addition, the oscillators 51 and 52 associated with the resonator pieces 1 and 2, respectively, operate with the fundamental harmonics having substantially the same frequency and, therefore, consume the same amount of power. Such oscillators 51 and 52, therefore, do not need an increase in power due to a higher harmonic with which the conventional oscillator using an SC cut crystal resonator deals.

While the resonator pieces 1 and 2 shown in FIGS. 4A and 5 have their electrodes 4 and 5 provided on one side thereof commonly connected, the electrodes 4 and 5 may be separated from each other and led to the outside independently of each other. As shown in FIG. 1, when the crystal resonators $Q_1$ and $Q_2$ and the oscillators 51 and 52 are commonly connected to ground, wirings on a printed circuit board will be simplified if they are commonly connected within a metallic case, as in any one of the specific configurations described above.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A temperature compensated oscillator comprising:
   first and second AT cut crystal resonator pieces having substantially the same natural oscillation frequency but different cut angles from each other;
   an electrically conductive support member supporting said first and second AT cut crystal resonator pieces;
   an electrically conductive case member having mounted therein said support member and housing said first and second AT cut crystal resonator pieces;
   electrode films formed on opposite surfaces of each said AT cut crystal resonator piece, the films on one surface of each said AT cut crystal resonator piece being electrically connected to said support member;
   first and second electrical leads connecting the electrode films the opposite surface of each said AT cut crystal resonator piece and passing through and terminating outside the case member, said electrical leads being electrically insulated from said case member;
   first and second oscillation circuits respectively connected to said first and second electrical leads and respectively excited by said first and second AT cut crystal resonator pieces to produce two different oscillation frequency output signals;
   difference frequency detecting means responsive to said two different oscillation frequency output signals for generating a digital output proportional to a phase difference between said two different oscillation frequency output signals;
   readout means responsive to said digital output for providing an output signal which fluctuates as a function of temperature;
   control voltage applying means for generating an analog voltage proportional to said output signal from said readout means; and
   a voltage controlled oscillator (VCO) having an oscillation frequency variable in response to a control voltage, said control voltage applying means applying to said VCO said analog voltage in such a manner as to cancel the influence of a change in temperature on said VCO as said control voltage.

2. An oscillator as claimed in claim 1, wherein said difference detecting means comprises a reversible counter for up-counting one of said two different oscillation frequency output signals while down-counting another of said two different oscillation frequency output signals, and wherein said control voltage applying means comprising:
   a Read Only Memory (ROM) storing in a plurality of addresses therefor a plurality of values which said control voltage may have as digital values, and selecting particular one of said plurality of addresses in response to an output of said reversible counter to thereby read a digital value stored in said particular address; and
   means for converting said digital value to the analog voltage.

3. A temperature detector comprising:
   first and second AT cut crystal resonator pieces having substantially the same natural oscillation frequency but different cut angles from each other;
   an electrically conductive support member supporting said first and second AT cut crystal resonator pieces;
   a case member having mounted therein said support member and housing said first and second AT cut crystal resonator pieces;
   electrode films formed on opposite surfaces of each said AT cut crystal resonator piece, the films on one surface of each said AT cut crystal resonator piece being electrically connected to said support member;
   first and second electrical leads connecting the electrode films the opposite surface of each said AT cut crystal resonator piece and terminating outside the case member;
   first and second oscillation circuits respectively connected to said first and second electrical leads and respectively excited by said first and second AT cut crystal resonator pieces to produce two different oscillation frequency output signals;
   difference frequency detecting means responsive to said two different oscillation frequency output signals for generating a digital output proportional to a phase difference between said two different oscillation frequency output signals; and readout means responsive to said digital output for providing an output signal which fluctuates as a function of temperature.

4. The temperature detector recited in claim 3 wherein said support member is a T-shaped member which supports said first and second AT cut crystal resonator pieces parallel to one another.

5. The temperature detector recited in claim 3 wherein said support member is a rod-shaped member which supports said first and second AT cut crystal resonator pieces at one end thereof in substantially the same plane.

6. The temperature detector recited in claim 3 wherein said difference frequency detecting means comprises a reversible counter for up-counting one of the two different oscillation frequency output signals while donw-counting another of the two different oscillation frequency output signals, and wherein said control voltage applying means comprises:

a Read Only Memory (ROM) storing in a plurality of addresses therefor a plurality of values which said control voltage may have as digital values, and selecting a particular one of said plurality of addresses in response to the output of said reversible counter to thereby read the digital value stored in said particular address; and means for converting said digital value to the analog voltage.

* * * * *